(12) United States Patent
Shi (10) Patent No.: US 12,165,727 B2
(45) Date of Patent: Dec. 10, 2024

(54) THREE-DIMENSIONAL MEMORY DEVICE AND METHOD FOR DETECTING LEAKAGE STATE

(71) Applicant: YANGTZE MEMORY TECHNOLOGIES CO., LTD., Wuhan (CN)

(72) Inventor: Weihua Shi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 179 days.

(21) Appl. No.: 17/728,792

(22) Filed: Apr. 25, 2022

(65) Prior Publication Data

US 2022/0351802 A1 Nov. 3, 2022

(30) Foreign Application Priority Data

Apr. 28, 2021 (CN) .......................... 202110466306.6

(51) Int. Cl.
*G11C 29/50* (2006.01)
*G11C 16/04* (2006.01)
*G11C 16/08* (2006.01)

(52) U.S. Cl.
CPC .... *G11C 29/50004* (2013.01); *G11C 16/0483* (2013.01); *G11C 16/08* (2013.01); *G11C 2029/5004* (2013.01)

(58) Field of Classification Search
CPC .......... G11C 29/50004; G11C 16/0483; G11C 2029/5004; G11C 16/26; G11C 16/3418; G11C 16/3427; G11C 16/22; G11C 29/50; G11C 16/08; G11C 2029/1202; G11C 29/44
See application file for complete search history.

(56) References Cited

U.S. PATENT DOCUMENTS

| 4,800,332 A | 1/1989 | Hutchins | |
| 9,443,610 B1* | 9/2016 | Pan ....................... | G11C 29/025 |
| 2005/0044459 A1* | 2/2005 | Scheuerlein ........... | G11C 29/78 |
| | | | 714/719 |
| 2011/0115548 A1* | 5/2011 | Kamp ..................... | E05B 45/06 |
| | | | 327/530 |
| 2012/0008384 A1* | 1/2012 | Li .......................... | G11C 29/02 |
| | | | 365/185.33 |

(Continued)

FOREIGN PATENT DOCUMENTS

| CN | 1830036 A | 9/2006 |
| CN | 101377960 A | 3/2009 |

*Primary Examiner* — Uyen Smet
(74) *Attorney, Agent, or Firm* — BAYES PLLC (57) ABSTRACT

A three-dimensional (3D) memory device includes a memory cell array formed by a plurality of memory cells, the memory cells in a same row are connected to a same word line; a word line driving circuit including a driving voltage source for providing a driving voltage to a selected word line; at least one word line leakage detection circuit, configured to detect a leakage state of the selected word line; and at least one coupling circuit corresponding to the word line leakage detection circuit. The coupling circuit includes a switch and an isolation capacitor arranged between the switch and the word line leakage detection circuit, and the isolation capacitor is used for isolating the word line leakage detection circuit and the word line driving circuit.

19 Claims, 8 Drawing Sheets

(56) References Cited

U.S. PATENT DOCUMENTS

| | | | |
|---|---|---|---|
| 2015/0029802 A1* | 1/2015 | Yamada | G11C 29/025 365/201 |
| 2016/0018454 A1* | 1/2016 | Jeon | G11C 29/12005 324/509 |
| 2021/0398602 A1* | 12/2021 | Lakshminarayana Addagalla et al. | G11C 16/0483 |

* cited by examiner

THREE-DIMENSIONAL MEMORY DEVICE AND METHOD FOR DETECTING LEAKAGE STATE

CROSS-REFERENCE TO RELATED APPLICATIONS

This application claims the benefit of priority to Chinese Application No. CN202110466306.6, filed on Apr. 28, 2021, which is hereby incorporated by reference in its entirety.

BACKGROUND

The present disclosure relates to three-dimensional (3D) memory devices and methods for detecting the leakage state.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

According to one aspect of the present disclosure, a 3D memory device is disclosed. The 3D memory device includes a memory cell array formed by a plurality of memory cells, the memory cells in a same row are connected to a same word line; a word line driving circuit including a driving voltage source for providing a driving voltage to a selected word line; at least one word line leakage detection circuit, configured to detect a leakage state of the selected word line; and at least one coupling circuit corresponding to the word line leakage detection circuit. The coupling circuit includes a switch and an isolation capacitor arranged between the switch and the word line leakage detection circuit, and the isolation capacitor is used for isolating the word line leakage detection circuit and the word line driving circuit.

In some implementations, the at least one coupling circuit couples the selected word line to the at least one word line leakage detection circuit according to a leakage detect instruction signal.

In some implementations, the 3D memory device further includes a bit line. The memory cell is disposed at an intersection of the word line and the bit line, and the at least one word line leakage detection circuit determines the leakage state between the selected word line and an adjacent word line or between the selected word line and the bit line based on a voltage change of the selected word line within a preset time.

In some implementations, the at least one word line leakage detection circuit determines a difference between a reference input voltage and a voltage of the selected word line after the preset time, and when the difference is greater than or equal to a preset threshold voltage, the leakage state between the selected word line and the adjacent word line or between the selected word line and the bit line is determined as abnormal.

In some implementations, the reference input voltage is between 2.1 volts and 2.6 volts. In some implementations, the preset threshold voltage is between 50 millivolts and 500 millivolts. In some implementations, a capacitance of the isolation capacitor is between 0.3 pF and 0.5 pF.

In some implementations, the at least one coupling circuit includes an electrostatic protection circuit disposed between the isolation capacitor and the at least one word line leakage detection circuit.

In some implementations, the at least one word line leakage detection circuit includes a comparator configured to determine a difference between a reference input voltage and a voltage of the selected word line. The comparator includes an adaptative resistor disposed at an output end of the comparator. In some implementations, a resistance of the adaptative resistor is between 3000 ohms and 10000 ohms.

According to another aspect of the present disclosure, a method for detecting a leakage state of a 3D memory device is disclosed. The 3D memory device includes a plurality of memory cells and a plurality of word lines, and the memory cells in a same row are connected to a same word line. A first preset voltage provided by a driving voltage source is provided to a selected word line and a first end of a coupling circuit. A second preset voltage is provided to an adjacent word line adjacent to the selected word line. A reference input voltage is provided to a second end of the coupling circuit. The selected word line and the first end of the coupling circuit are disconnected from the driving voltage source, and the second end of the coupling circuit is disconnected from the reference input voltage. A voltage of the second end of the coupling circuit is detected, and a first difference between the reference input voltage and the voltage of the second end of the coupling circuit is determined. When the first difference is greater than or equal to a first preset threshold voltage, a leakage state between the selected word line and the adjacent word line is determined as abnormal.

In some implementations, a voltage of the first end of the coupling circuit is coupled with the voltage of the second end of the coupling circuit through an isolation capacitor of the coupling circuit.

In some implementations, the second preset voltage is a ground voltage. In some implementations, the first preset voltage is greater than or equal to 10 volts. In some implementations, the first preset threshold voltage is between 50 millivolts and 500 millivolts. In some implementations, the reference input voltage is between 2.1 volts and 2.6 volts.

In some implementations, after disconnecting the selected word line and the driving voltage source, the method further includes setting the selected word line to a floating status.

In some implementations, the 3D memory device further includes a bit line, and the memory cell is disposed at an intersection of the word line and the bit line. The selected word line is connected to the driving voltage source, and the bit line is connected to the ground voltage.

In some implementations, the voltage of the second end of the coupling circuit is detected, and a second difference between the reference input voltage and the voltage of the second end of the coupling circuit is determined. When the second difference is greater than or equal to a second preset threshold voltage, a leakage state between the selected word line and the bit line is determined as abnormal.

According to still another aspect of the present disclosure, a memory system is disclosed. The memory system includes a 3D memory device configured to store data, and a memory controller. The 3D memory device includes a memory cell array formed by a plurality of memory cells, the memory cells in a same row are connected to a same word line; a word line driving circuit including a driving voltage source for providing a driving voltage to a selected word line; at least one word line leakage detection circuit, configured to detect a leakage state of the selected word line; and at least one coupling circuit corresponding to the word line leakage detection circuit. The coupling circuit includes a switch and an isolation capacitor arranged between the switch and the word line leakage detection circuit, and the isolation capacitor is used for isolating the word line leakage detection circuit and the word line driving circuit when the word line driving circuit is in a word line working mode. The memory controller is coupled to the 3D memory device and is configured to control operations of the 3D memory device.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

The non-volatile memory with vertically stacked memory cells, also known as the 3D memory device, is widely used in electronic devices, which typically includes word lines connecting multiple memory cells located in the same row and bit lines connecting multiple memory cells located in the same column. Under some situations, there may be a leakage state between the word line and the word line and/or between the word line and the bit line.

A word line leakage detection method generally requires connecting a word line to be detected to an external test module, and determining, by an external test module, a leakage state of the word line. However, the electrical signal output control capability of the Precision Measurement Unit (PMU) in the external test module is limited, the word line leakage detection method cannot detect multiple word lines simultaneously, and the detection time is too long, resulting in the long test time of the 3D memory device.

To address one or more of the aforementioned issues, the present disclosure introduces the 3D memory devices, and the methods for detecting the leakage state between the word lines.

Figure 1:
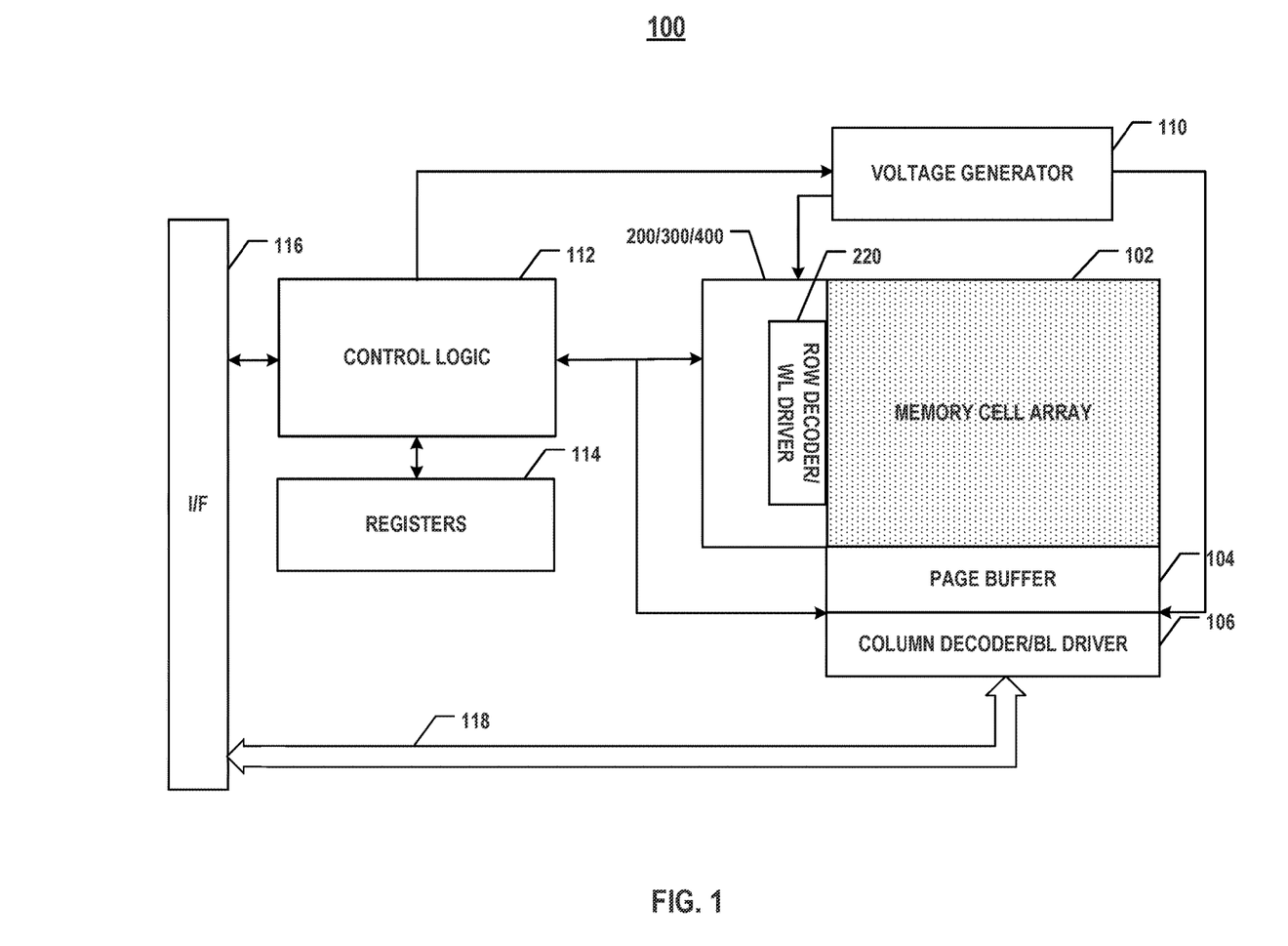
FIG. 1 illustrates an exemplary 3D memory device, according to some aspects of the present disclosure.

FIG. 1 illustrates an exemplary 3D memory device 100, according to some aspects of the present disclosure. 3D memory device 100 may be or include a 3D NAND memory device. As shown in FIG. 1, 3D memory device 100 can include a memory cell array 102 including an array of NAND memory cells in the form of NAND memory strings. 3D memory device 100 can also include peripheral circuits configured to facilitate the operations of NAND memory cells, such as read, program, and erase. The peripheral circuits can include, for example, a page buffer 104, a column decoder/bit line driver 106, a row decoder (word line driver) 220, a voltage generator 110, control logic 112, registers 114, an interface 116, and a data bus 118. It is understood that in some examples, additional peripheral circuits may be included as well.

Page buffer 104 can be configured to read and program data from and to memory cell array 102 according to the control of control logic 112. In one example, page buffer 104 may store one page of program data (write data) to be programmed into one page of memory cell array 102. In another example, page buffer 104 also performs program verify operations to ensure that the data has been properly programmed into memory cells coupled to selected word lines. Row decoder 220 can be configured to be controlled by control logic 112 and select a block of memory cell array 102 and a word line of the selected block. Row decoder 220 can be further configured to drive the selected word line using a word line voltage generated from voltage generator 110. Voltage generator 110 can be configured to be controlled by control logic 112 and generate the word line voltages (e.g., read voltage, program voltage, pass voltage, local voltage, and verification voltage) to be supplied to memory cell array 102. Column decoder/bit line driver 106 can be configured to be controlled by control logic 112 and select one or more NAND memory strings by applying bit line voltages generated from voltage generator 110. For example, column decoder/bit line driver 106 may apply column signals for selecting a set of Nbits of data from page buffer 104 to be outputted in a read operation.

Control logic 112 can be coupled to each peripheral circuit and configured to control operations of peripheral circuits. Registers 114 can be coupled to control logic 112 and include status registers, command registers, and address registers for storing status information, command operation codes (OP codes), and command addresses for controlling the operations of each peripheral circuit.

Interface 116 can be coupled to control logic 112 and act as a control buffer to buffer and relay control commands received from a host (not shown) to control logic 112 and status information received from control logic 112 to the host. Interface 116 can also be coupled to page buffer 104 via column decoder/bit line driver 106 and act as an input/output (I/O) interface and a data buffer to buffer and relay the program data received from a host (not shown) to page buffer 104 and the read data from page buffer 104 to the host. As shown in FIG. 1, bidirectional data bus 118 can connect interface 116 and column decoder/bit line driver 106 for transferring data to and from memory cell array 102. In some implementations, 3D memory device 100 further includes a word line driving circuit 200, a coupling circuit 300, and a word line leakage detection circuit 400 used for detecting the leakage state between the word lines.

Figure 2:
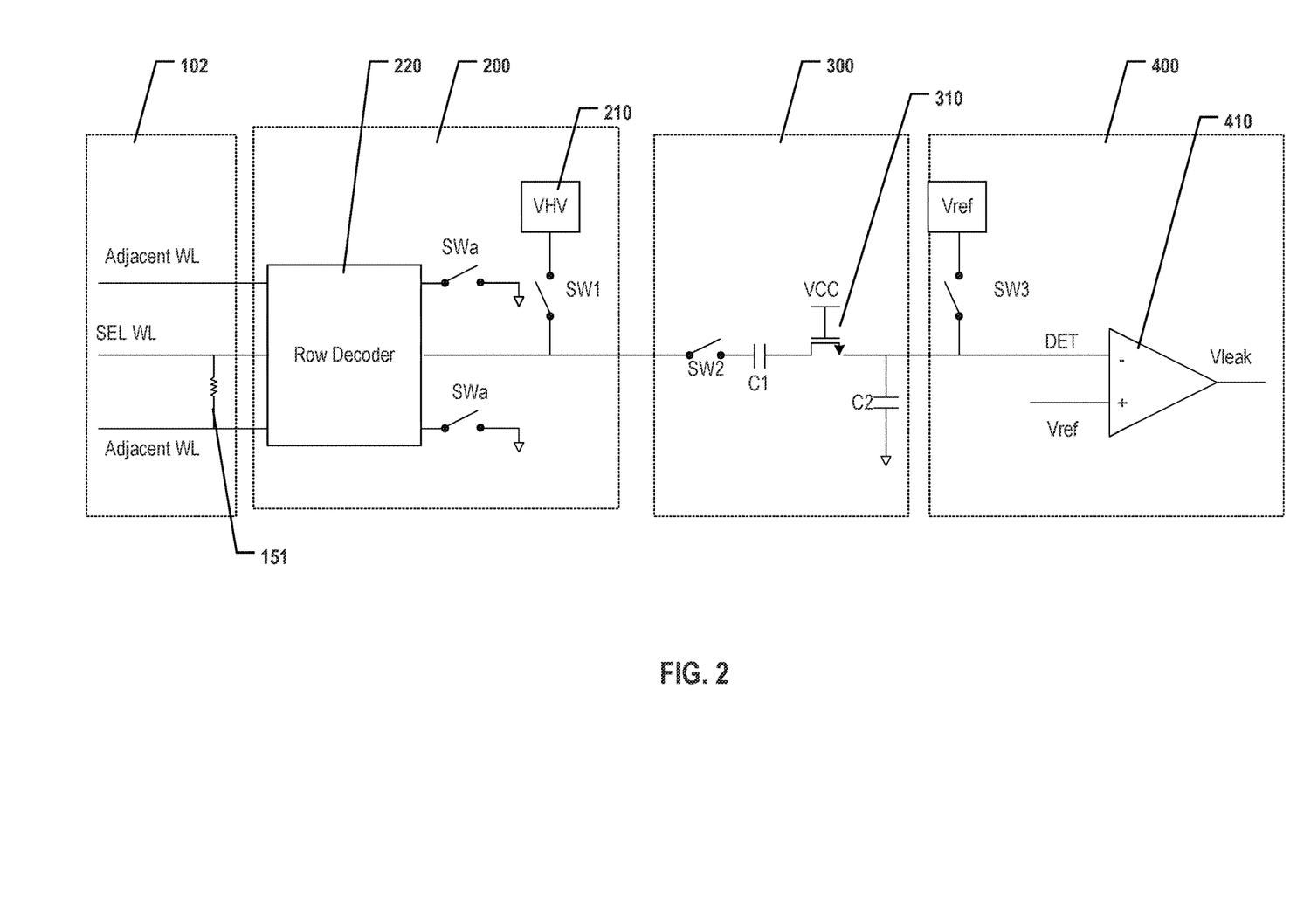
FIG. 2 illustrates an exemplary structure and an exemplary operation mode of a 3D memory device, according to some aspects of the present disclosure.
Figure 3:
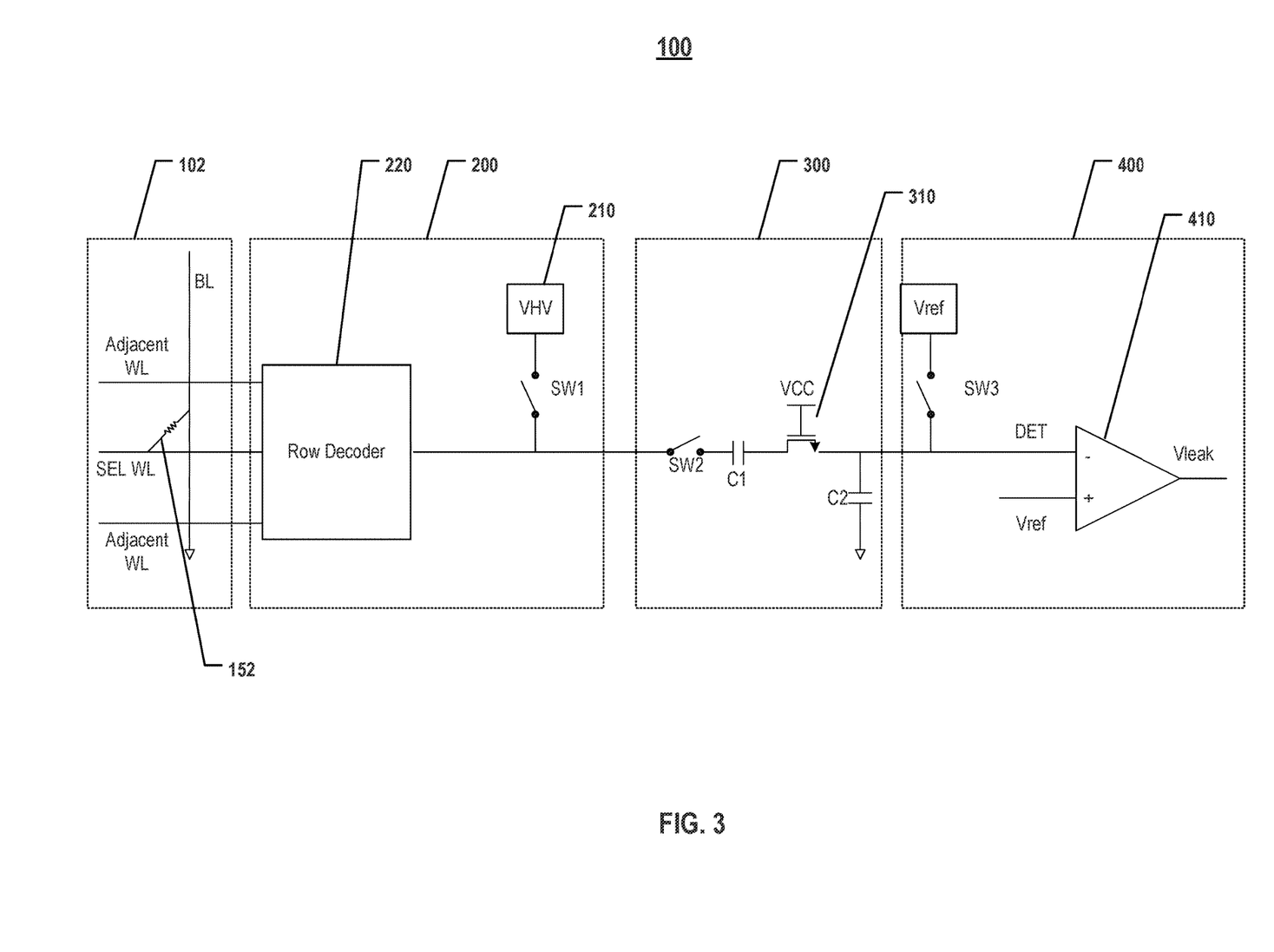
FIG. 3 illustrates an exemplary structure and an exemplary operation mode of a 3D memory device, according to some aspects of the present disclosure.

FIG. 2 illustrates an exemplary structure and an exemplary operation mode of 3D memory device 100, according to some aspects of the present disclosure; and FIG. 3 illustrates an exemplary structure and another exemplary operation mode of 3D memory device 100, according to some aspects of the present disclosure. As shown in FIG. 2 and FIG. 3, 3D memory device 100 includes memory cell array 102, word line driving circuit 200, coupling circuit 300, and word line leakage detection circuit 400. It is understood that other portions of 3D memory device 100 described in FIG. 1 are not shown in FIG. 2 and FIG. 3.

Memory cell array 102 includes a plurality of memory cells (not shown), a word line WL, and a bit line BL disposed vertically with the word line WL. The control gates of the plurality of memory cells located in the same row may be connected to the same word line WL, and the drains of the plurality of memory cells located in the same column may be connected to the same bit line BL. In other words, the storage unit (memory cell) may be disposed at the intersection of the word line WL and the bit line BL.

Word line drive circuit 200 may include a drive voltage source 210 and row decoder 220. Row decoder 220 may couple a voltage source, such as drive voltage source 210, to a selected word line SEL WL. For example, in a word line working mode, the word line drive circuit 200 may perform operations, such as writing or reading, by applying different voltages to selected word line SEL WL. For another example, in a word line leakage detection mode, word line leakage detection circuit 400 may charge selected word line SEL WL (the to-be-detected word line) through driving voltage source 210. Here, selected word line SEL WL is the word line that will be detected the leakage state in the following operations.

Specifically, in some implementations, in response to the leakage detect instruction signal, driving voltage source 210 may be coupled to at least one selected word line SEL WL through a switch SW1 and row decoder 220. In some implementations, the leakage detect instruction signal is used for switching on/off the switches in word line drive circuit 200, coupling circuit 300, and word line leakage detection circuit 400, such as SW1, SW2, SW3, and/or SWa.

Coupling circuit 300 may include a switch SW2 and a high voltage isolation capacitor C1 disposed between switch SW2 and word line leakage detection circuit 400. In some implementations, switch SW2 may be an array selection switch. In some implementations, according to the operating voltage range of switch SW2, switch SW2 may be an N-type transistor or a low-voltage P-type transistor, which is not limited in the present disclosure.

In some implementations, in response to the leakage detect instruction signal, coupling circuit 300 may couple at least one selected word line SEL WL to at least one word line leakage detection circuit 400. High voltage isolation capacitor C1 can effectively isolate word line leakage detection circuit 400 and the word line working circuit, and implement switching the word line between the high-voltage working mode and the low-voltage leakage detection mode. In some implementations, the capacitance of high-voltage isolation capacitor C1 may be determined by the voltage coupling rate. In some implementations, the capacitance of high-voltage isolation capacitor C1 may be determined by the size of memory cell array 102. In some implementations, the capacitance of high-voltage isolation capacitor C1 may be between 0.3 and 0.5 pF.

In some implementations, an electrostatic protection circuit 310 may be provided between high voltage isolation capacitor C1 and word line leakage detection circuit 400. Electrostatic protection circuit 310 may have strong current discharge capability and capacitance transient characteristics. When the electrostatic voltage is applied to electrostatic protection circuit 310, the transient effect of the capacitor is very obvious due to the fact that the resistance-capacitance (RC) time constant (about 1 us or more) is much longer than the electrostatic voltage loading time (about 10 ns), so that the voltage at the input end of word line leakage detection circuit 400 cannot be raised immediately, and the failure of the safe operating area (SOA) of the low voltage leakage detection circuit can be effectively prevented.

Word line leakage detection circuit 400 may be built into 3D memory device 100 and includes a comparator 410 for determining a difference between the reference input voltage Vref and the voltage of the selected word line to be detected. In some implementations, word line leakage detection circuit 400 may be configured to identify a leakage state between at least one selected word line SEL WL and the adjacent word line or between at least one selected word line SEL WL and bit line BL through a voltage change of at least one selected word line SEL WL within a preset time.

In some implementations, after the preset time, the difference between the reference input voltage Vref and the voltage of selected word line SEL WL at the node DET may be determined by word line leakage detection circuit 400. When the difference is greater than or equal to the preset threshold voltage, it is determined that the leakage state between selected word line SEL WL and the adjacent word line or between selected word line SEL WL and bit line BL is abnormal.

In FIG. 2, when there is an electric leakage between selected word line SEL WL and the adjacent word line, a leakage path may be represented by the equivalent resistor 151 located between selected word line SEL WL and the adjacent word line. When the electric leakage does not occur between selected word line SEL WL and the adjacent word line, the leakage path and equivalent resistor 151 may not exist. Similarly, in FIG. 3, when there is an electric leakage between selected word line SEL WL and bit line BL, a leakage path may be represented by the equivalent resistor 152 located between selected word line SEL WL and bit line BL. When the electric leakage does not occur between selected word line SEL WL and bit line BL, the leakage path and the equivalent resistor 152 may not exist.

In some implementations, reference input voltage Vref of word line leakage detection circuit 400 is not limited. In some implementations, reference input voltage Vref of word line leakage detection circuit 400 may be arranged between 2.1 volts and 2.6 volts. In some implementations, reference input voltage Vref of word line leakage detection circuit 400 may be 2.4 volts.

In some implementations, a preset threshold voltage of comparator 410 may not be limited. In some implementations, the preset threshold voltage of comparator 410 may be arranged between 50 mV and 500 mV. In some implementations, the preset threshold voltage of comparator 410 may be 100 mV, 200 mV, 300 mV, 400 mV, or 500 mV. In some implementations, the preset threshold voltage of comparator 410 may be 500 mV. In other words, after the voltage of selected word line SEL WL reaches a predetermined value, word line leakage detection circuit 400 may wait a preset time. If the leakage exists between selected word line SEL WL and the adjacent word line or between selected word line SEL WL and bit line BL, the voltage of selected word line SEL WL will be decreased. Word line leakage detection circuit 400 can determine the voltage difference between reference input voltage Vref and selected word line SEL WL after the drop. When the difference is greater than or equal to the preset threshold voltage, it indicates that the leakage of selected word line SEL WL is detected, and the current leakage is outside the allowable range. The preset threshold voltage and the preset waiting time may be determined based on the allowable range of the current leakage and the predetermined value of the voltage of selected word line SEL WL.

FIG. 2 and FIG. 3 show word line leakage detection circuit 400 and coupling circuit 300 corresponding to one selected word line SEL WL. It is understood that since coupling circuit 300 and word line leakage detection circuit 400 provided in the present application are both implemented by a low-voltage device, the area of the circuit is small, and multiple coupling circuits 300 and multiple word line leakage detection circuits 400 may be provided in 3D memory device 100, so as to detect the leakage condition between multiple word lines and between the word lines and the bit lines. Further, since multiple coupling circuits 300 and multiple word line leakage detection circuits 400 may correspond to each other, each of the multiple word line leakage detection circuits 400 disposed in 3D memory device 100 may be independently controlled.

By establishing word line leakage detection circuit 400 in 3D memory device 100, the present application may realize the on-chip word line leakage detection. Hence, the detection time of the leakage condition between the word lines or between the word line and the bit line may be shortened, for example, reducing the detection time to one-third or one-sixth of the time required by the external word line leakage detection method.

Figure 4:
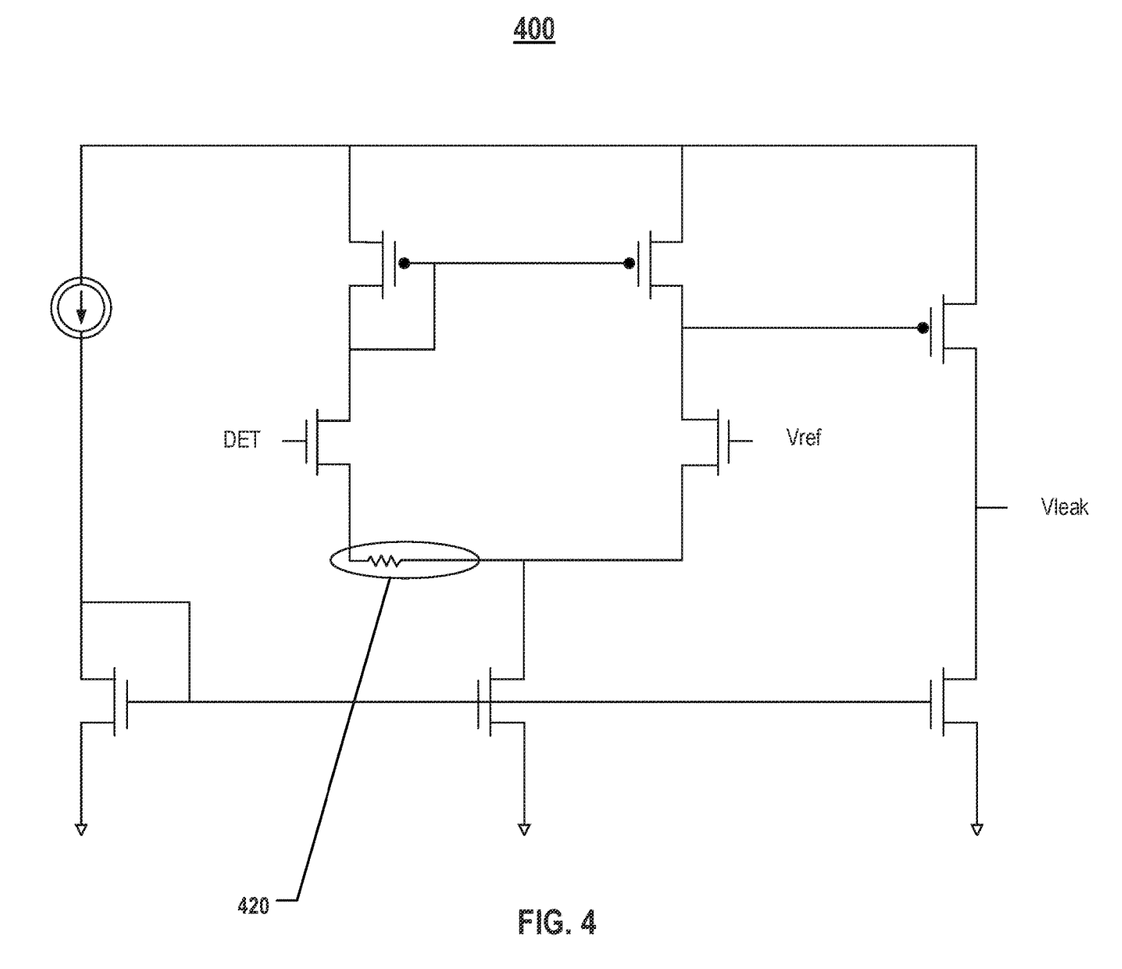
FIG. 4 illustrates an exemplary structure of a word line leakage detection circuit, according to some aspects of the present disclosure.

FIG. 4 illustrates an exemplary structure of word line leakage detection circuit 400, according to some aspects of the present disclosure. As shown in FIG. 4, in some implementations, word line leakage detection circuit 400 may further include an adaptative resistor 420, and adaptative resistor 420 may be disposed at an output end of comparator 410. By setting adaptative resistor 420 at the output end of comparator 410 of word line leakage detection circuit 400, the random deviation in the leakage detection result between the word lines or between the word line and the bit line due to device mismatch may be prevented. In some implementations, the resistance of adaptative resistor 420 may be between 3,000 and 10,000 ohms. In some implementations, adaptative resistor 420 may have a resistance of 5,000 ohms.

Figure 5:
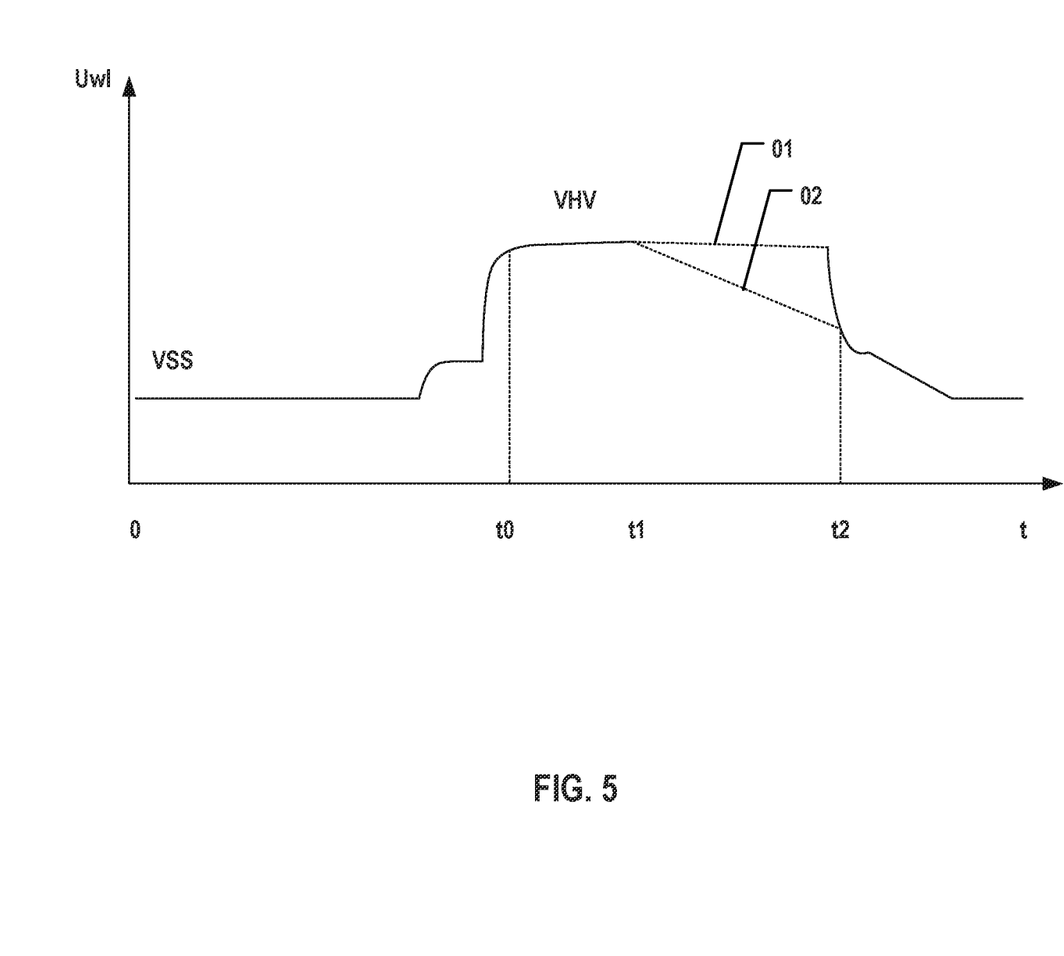
FIG. 5 illustrates an exemplary coordinate diagram of the voltage and time of a word line, according to some aspects of the present disclosure.
Figure 6:
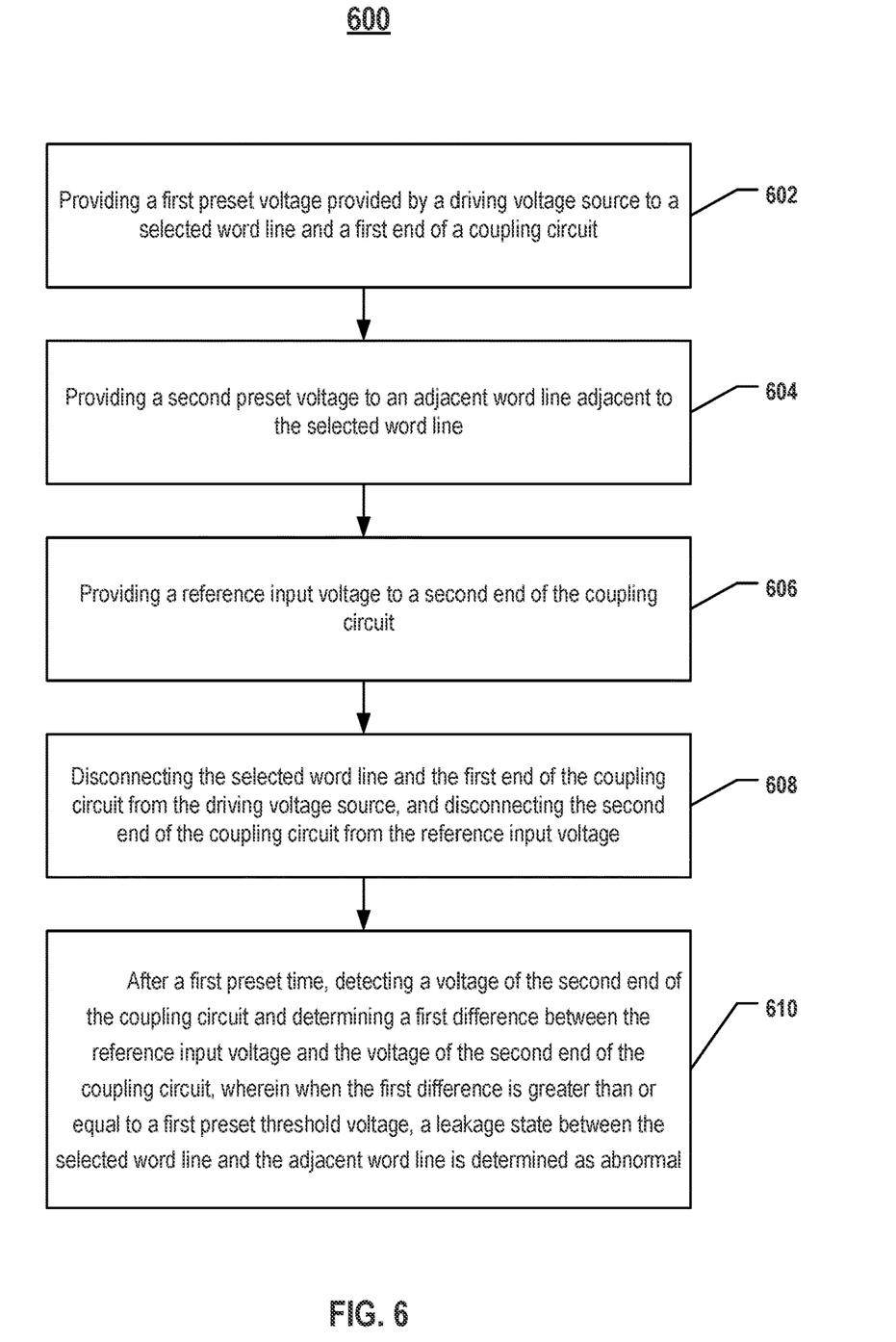
FIG. 6 illustrates a flowchart of an exemplary method for detecting the leakage state of a 3D memory device, according to some aspects of the present disclosure.

FIG. 5 illustrates an exemplary coordinate diagram of the voltage and time of selected word line SEL WL, according to some aspects of the present disclosure. FIG. 6 illustrates a flowchart of an exemplary method 600 for detecting the leakage state of 3D memory device 100, according to some aspects of the present disclosure. For the purpose of better describing the present disclosure, the coordinate diagram of the voltage and time of selected word line SEL WL in FIG. 5 and method 600 in FIG. 6 will be discussed together. It is understood that the operations shown in method 600 are not exhaustive and that other operations may be performed as well before, after, or between any of the illustrated operations. Further, some of the operations may be performed simultaneously, or in a different order than shown in FIG. 6.

At time 0, as shown in FIG. 5, the initial voltage of any selected word line SEL WL and the adjacent word lines is VSS. In some implementations, the voltage VSS may be the ground voltage.

As shown in operations 602 and 604 in FIG. 6, during time 0-t0, in response to the leakage detection instruction signal, at least one selected word line SEL WL is coupled to driving voltage source 210 through switch SW1 and row decoder 220, and the two adjacent word lines adjacent to selected word line SEL WL are coupled to the voltage VSS, for example, the ground voltage, through the switch SWa and row decoder 220. In some implementations, switch SW2 shown in FIG. 2 may be closed. In some implementations, selected word line SEL WL is connected a first end of coupling circuit 300, and during time 0-t0, the first end of coupling circuit 300 is connected to driving voltage source

210. In some implementations, the first end of coupling circuit 300 is connected a first end of high voltage isolation capacitor C1 when SW2 is closed.

In some implementations, 3D memory device 100 may include multiple switches, for example, switches SW1, SW2, SW3, and/or SWa. In some implementations, an N-type transistor or a low-voltage P-type transistor may be selected as switches SW1, SW2, SW3, and/or SWa according to the operating voltage range.

In some implementations, in response to the leakage detection instruction signal, during time 0-t0, selected word line SEL WL and the first end of high voltage isolation capacitor C1 are charged to a first preset voltage. In some implementations, the first preset voltage may be selected as the voltage value VHV, which is the word line operation voltage. For example, in the word line working mode, the word line operation voltage is applied to 3D memory device 100 to perform a read operation. In some implementations, the first preset voltage of selected word line SEL WL may be selected from other suitable voltage levels, which is not limited.

In some implementations, the first preset voltage of selected word line SEL WL may be a relatively high voltage value, for example, greater than or equal to 10 volts. When charging selected word line SEL WL with a higher voltage level, the leakage voltage of selected word line SEL WL may also be relatively increased, and the detection time required to detect the leakage state may therefore be correspondingly reduced.

At the same time, as shown in operation 606 in FIG. 6, switch SW3 shown in FIG. 2 may be closed, and reference input voltage Vref may be provided to the second end of coupling circuit 300. In some implementations, reference input voltage Vref may be provided to the second end of high voltage isolation capacitor C1 through switch SW3 and electrostatic protection circuit 310.

As shown in FIG. 5, after the charging time 0-t0, the real-time voltage Uwl of selected word line SEL WL tends to be stable. At time t0, the real-time voltage Uwl of selected word line SEL WL is gradually stabilized at the first preset voltage. For example, the real-time voltage Uwl of selected word line SEL WL is gradually stabilized at the voltage value VHV.

As shown in operation 608 in FIG. 6, at time t1, switches SW1 and SW3 are open, selected word line SEL WL and the first end of high voltage isolation capacitor C1 are disconnected from driving voltage source 210, and the second end of high voltage isolation capacitor C1 is disconnected from reference input voltage Vref.

In some implementations, the voltage change at the first end of high voltage isolation capacitor C1 may be coupled to the second end of high voltage isolation capacitor C1 by the capacitor voltage coupling. In other words, selected word line SEL WL may be charged with a higher voltage level, and the high voltage change at the first end of high voltage isolation capacitor C1 may be coupled to the lower voltage change at the second end of high voltage isolation capacitor C1. For example, selected word line SEL WL may be charged with the voltage value VHV, which may be greater than or equal to 10 volts, and the voltage change corresponding to the voltage value VHV may be coupled at the second end of high voltage isolation capacitor C1, for example, reference input voltage Vref, which may be between 2.1 volts and 2.6 volts.

As shown in operation 610 in FIG. 6, after a first preset time t1-t2, a voltage of the second end of the coupling circuit may be detected. In some implementations, the voltage at the second end of high voltage isolation capacitor C1 may be detected by the negative input end DET of comparator 410. Comparator 410 may determine a first difference between reference input voltage Vref and the voltage at the second end of high voltage isolation capacitor C1. In some implementations, when the first difference is greater than or equal to a first preset threshold voltage, comparator 410 may output the determination result Vleak representing a leakage state between selected word line SEL WL and the adjacent word line. In some implementations, when the first difference is less than the first preset threshold voltage, comparator 410 will not output the determination result Vleak. In some implementations, the first preset time, reference input voltage Vref, and the first preset threshold voltage may be predefined according to different applications. In some implementations, selected word line SEL WL may be set as a floating state during the leakage detection operations.

When there is an electric leakage between selected word line SEL WL and the adjacent word line, a leakage path may be represented by the equivalent resistor 151 located between selected word line SEL WL and the adjacent word line. When the electric leakage does not occur between selected word line SEL WL and the adjacent word line, the leakage path and equivalent resistor 151 may not exist. In some implementations, reference input voltage Vref of word line leakage detection circuit 400 is not limited. In some implementations, reference input voltage Vref of word line leakage detection circuit 400 may be arranged between 2.1 volts and 2.6 volts. In some implementations, reference input voltage Vref of word line leakage detection circuit 400 may be 2.4 volts.

In some implementations, a first preset threshold voltage of comparator 410 may not be limited. In some implementations, the first preset threshold voltage of comparator 410 may be arranged between 50 mV and 500 mV. In some implementations, the first preset threshold voltage of comparator 410 may be 100 mV, 200 mV, 300 mV, 400 mV, or 500 mV. In some implementations, the first preset threshold voltage may be 500 millivolts. In other words, after the voltage Uwl of selected word line SEL WL reaches the voltage level VHV at t1, word line leakage detection circuit 400 may wait the first preset time t1-t2. If there is no leakage condition between selected word line SEL WL and the adjacent word line, the voltage Uwl of selected word line SEL WL remains substantially constant and does not change, as shown by the dashed line 01 in FIG. 5. If there is a leakage condition between selected word line SEL WL and the adjacent word line, the voltage of selected word line SEL WL is reduced as shown by the dashed line 02 in FIG. 5.

The voltage difference between the second end of high voltage isolation capacitor C1 and reference input voltage Vref may be determined by word line leakage detection circuit 400. When the difference is greater than or equal to the first preset threshold voltage, it is indicated that the leakage current of selected word line SEL WL is outside the allowable range, and the leakage state is abnormal. Further, the first preset threshold voltage and the first preset time t1-t2 may be determined based on the allowable range of the leakage current and the predetermined value of selected word line SEL WL. In some implementations, the first preset time t1-t2 may be between 5 microseconds and 1000 microseconds. In some implementations, during the first preset time t1-t2, selected word line SEL WL should be set to a floating state, and switch SW1 may be opened.

By applying the method for detecting the leakage state between the word lines, word line leakage detection circuit 400 can be built into or integrated with 3D memory device 100 and can be independently controllable based on a one-to-one corresponding coupling circuit 300. Multiple word line leakage detection circuits are built into 3D memory device 100, and the leakage detection time between the word lines is shortened. Further, multiple word line leakage detection circuits disposed in 3D memory device 100 may detect electric leakage between the word lines at the same time.

Figure 7:
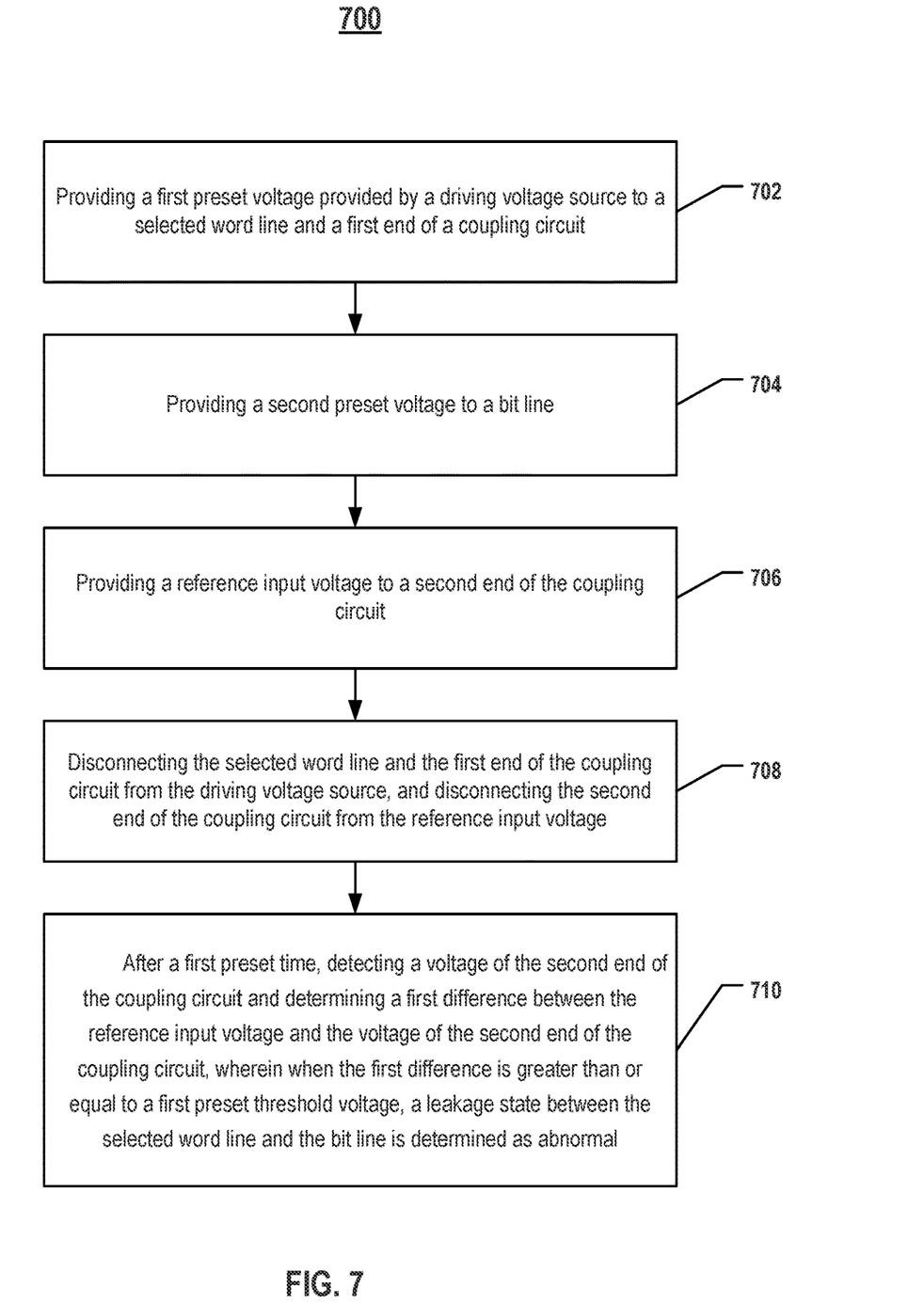
FIG. 7 illustrates a flowchart of an exemplary method for detecting the leakage state of a 3D memory device, according to some aspects of the present disclosure.

FIG. 7 illustrates a flowchart of an exemplary method 700 for detecting the leakage state of 3D memory device 100, according to some aspects of the present disclosure. It is understood that the operations shown in method 700 are not exhaustive and that other operations may be performed as well before, after, or between any of the illustrated operations. Further, some of the operations may be performed simultaneously, or in a different order than shown in FIG. 7.

At time 0, as shown in FIG. 5, the initial voltage of any selected word line SEL WL and the adjacent word lines is VSS. In some implementations, the voltage VSS may be the ground voltage.

As shown in operations 702 and 704 in FIG. 7, during time 0-t0, in response to the leakage detection instruction signal, at least one selected word line SEL WL is coupled to driving voltage source 210 through switch SW1 and row decoder 220, and bit line BL is coupled to the voltage VSS, for example, the ground voltage. In some implementations, switch SW2 shown in FIG. 3 may be closed. In some implementations, selected word line SEL WL is connected a first end of coupling circuit 300, and during time 0-t0, the first end of coupling circuit 300 is connected to driving voltage source 210. In some implementations, the first end of coupling circuit 300 is connected a first end of high voltage isolation capacitor C1 when SW2 is closed.

In some implementations, in response to the leakage detection instruction signal, during time 0-t0, selected word line SEL WL and the first end of high voltage isolation capacitor C1 are charged to a second preset voltage. In some implementations, the second preset voltage may be selected as the voltage value VHV, which is the word line operation voltage. For example, in the word line working mode, the word line operation voltage is applied to 3D memory device 100 to perform a read operation. In some implementations, the second preset voltage of selected word line SEL WL may be selected from other suitable voltage levels, which is not limited.

In some implementations, the second preset voltage of selected word line SEL WL may be a relatively high voltage value, for example, greater than or equal to 10 volts. When charging selected word line SEL WL with a higher voltage level, the leakage voltage of selected word line SEL WL may also be relatively increased, and the detection time required to detect the leakage state may therefore be correspondingly reduced.

At the same time, as shown in operation 706 in FIG. 7, switch SW3 shown in FIG. 3 may be closed, and reference input voltage Vref may be provided to the second end of coupling circuit 300. In some implementations, reference input voltage Vref may be provided to the second end of high voltage isolation capacitor C1 through switch SW3 and electrostatic protection circuit 310.

As shown in FIG. 5, after the charging time 0-t0, the real-time voltage Uwl of selected word line SEL WL tends to be stable. At time t0, the real-time voltage Uwl of selected word line SEL WL is gradually stabilized at the second preset voltage. For example, the real-time voltage Uwl of selected word line SEL WL is gradually stabilized at the voltage value VHV.

As shown in operation 708 in FIG. 6, at time t1, switches SW1 and SW3 are open, selected word line SEL WL and the first end of high voltage isolation capacitor C1 are disconnected from driving voltage source 210, and the second end of high voltage isolation capacitor C1 is disconnected from reference input voltage Vref.

In some implementations, the voltage change at the first end of high voltage isolation capacitor C1 may be coupled to the second end of high voltage isolation capacitor C1 by the capacitor voltage coupling. In other words, selected word line SEL WL may be charged with a higher voltage level, and the high voltage change at the first end of high voltage isolation capacitor C1 may be coupled to the lower voltage change at the second end of high voltage isolation capacitor C1. For example, selected word line SEL WL may be charged with the voltage value VHV, which may be greater than or equal to 10 volts, and the voltage change corresponding to the voltage value VHV may be coupled at the second end of high voltage isolation capacitor C1, for example, reference input voltage Vref, which may be between 2.1 volts and 2.6 volts.

As shown in operation 710 in FIG. 7, after a second preset time t1-t2, a voltage of the second end of the coupling circuit may be detected. In some implementations, the voltage at the second end of high voltage isolation capacitor C1 may be detected by the negative input end DET of comparator 410. Comparator 410 may determine a second difference between reference input voltage Vref and the voltage at the second end of high voltage isolation capacitor C1. In some implementations, when the second difference is greater than or equal to a second preset threshold voltage, comparator 410 may output the determination result Vleak representing a leakage state between selected word line SEL WL and bit line BL. In some implementations, when the second difference is less than the second preset threshold voltage, comparator 410 will not output the determination result Vleak. In some implementations, the second preset time, reference input voltage Vref, and the second preset threshold voltage may be predefined according to different applications. In some implementations, selected word line SEL WL may be set as a floating state during the leakage detection operations.

When there is an electric leakage between selected word line SEL WL and the bit line, a leakage path may be represented by the equivalent resistor 152 located between selected word line SEL WL and the bit line. When the electric leakage does not occur between selected word line SEL WL and the bit line, the leakage path and equivalent resistor 152 may not exist. In some implementations, reference input voltage Vref of word line leakage detection circuit 400 is not limited. In some implementations, reference input voltage Vref of word line leakage detection circuit 400 may be arranged between 2.1 volts and 2.6 volts. In some implementations, reference input voltage Vref of word line leakage detection circuit 400 may be 2.4 volts.

In some implementations, a second preset threshold voltage of comparator 410 may not be limited. In some implementations, the second preset threshold voltage of comparator 410 may be arranged between 50 mV and 500 mV. In some implementations, the second preset threshold voltage of comparator 410 may be 100 mV, 200 mV, 300 mV, 400 mV, or 500 mV. In some implementations, the second preset threshold voltage may be 500 millivolts. In other words, after the voltage Uwl of selected word line SEL WL reaches the voltage level VHV at t1, word line leakage detection circuit 400 may wait the second preset time t1-t2. If there is no leakage condition between selected word line SEL WL and the bit line, the voltage Uwl of selected word line SEL WL remains substantially constant and does not change, as shown by the dashed line 01 in FIG. 5. If there is a leakage condition between selected word line SEL WL and the bit line, the voltage of selected word line SEL WL is reduced, as shown by the dashed line 02 in FIG. 5.

The voltage difference between the second end of high voltage isolation capacitor C1 and reference input voltage Vref may be determined by word line leakage detection circuit 400. When the difference is greater than or equal to the second preset threshold voltage, it is indicated that the leakage current of selected word line SEL WL is outside the allowable range, and the leakage state is abnormal. Further, the second preset threshold voltage and the second preset time t1-t2 may be determined based on the allowable range of the leakage current and the predetermined value of selected word line SEL WL. In some implementations, the second preset time t1-t2 may be between 5 microseconds and 1000 microseconds. In some implementations, during the second preset time t1-t2, selected word line SEL WL should be set to a floating state, and switch SW1 may be opened.

By applying the method for detecting the leakage state between the word line and the bit line, word line leakage detection circuit 400 can be built into or integrated with 3D memory device 100 and can be independently controllable based on a one-to-one corresponding coupling circuit 300. Multiple word line leakage detection circuits are built into 3D memory device 100, and the leakage detection time between the word lines is shortened. Further, multiple word line leakage detection circuits disposed in 3D memory device 100 may detect electric leakage between the word line and the bit line at the same time.

Figure 8:
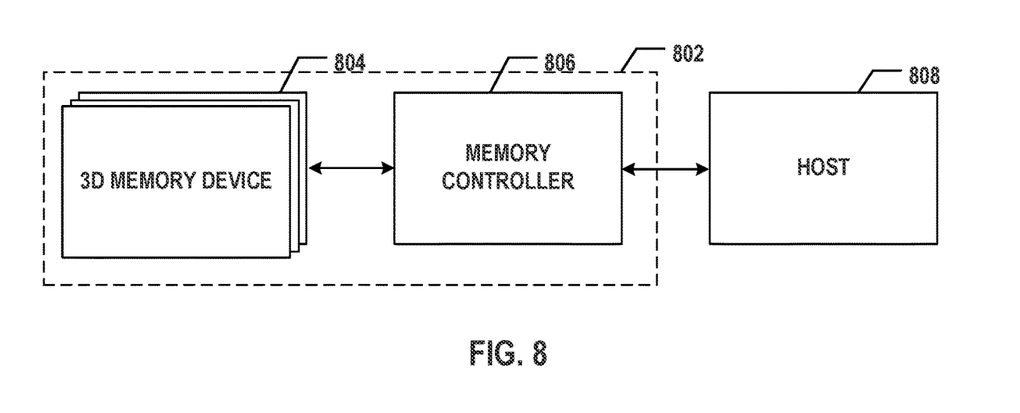
FIG. 8 illustrates a block diagram of an exemplary system having a memory device, according to some aspects of the present disclosure.

FIG. 8 illustrates a block diagram of an exemplary system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive data to or from memory devices 804.

Memory device 804 can be any memory device disclosed in the present disclosure. As disclosed above in detail, memory device 804, such as a NAND Flash memory device, may have a controlled and predefined discharge current in the discharge operation of discharging the bit lines. Memory controller 806 is coupled to memory device 804 and host 808 and is configured to control memory device 804, according to some implementations. Memory controller 806 can manage the data stored in memory device 804 and communicate with host 808. For example, memory controller 806 may be coupled to memory device 804, such as 3D memory device 100 described above, and memory controller 806 may be configured to control the operations of the channel structure through the peripheral device. By applying the word line leakage detect circuit or the method for detecting the leakage state between the word lines or between the word line and the bit line, word line leakage detection circuit 400 can be built into or integrated with 3D memory device 100 and can be independently controllable based on a one-to-one corresponding coupling circuit 300. Multiple word line leakage detection circuits are built into 3D memory device 100, and the leakage detection time between the word lines is shortened. Further, multiple word line leakage detection circuits disposed in 3D memory device 100 may detect electric leakage between the word lines or between the word line and the bit line at the same time.

In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804. Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 9A:
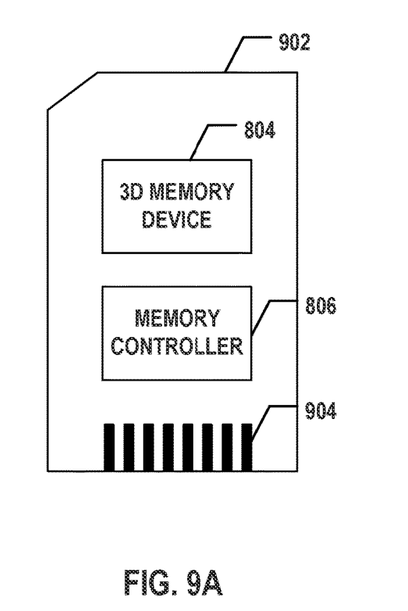
FIG. 9A illustrates a diagram of an exemplary memory card having a memory device, according to some aspects of the present disclosure.
Figure 9B:
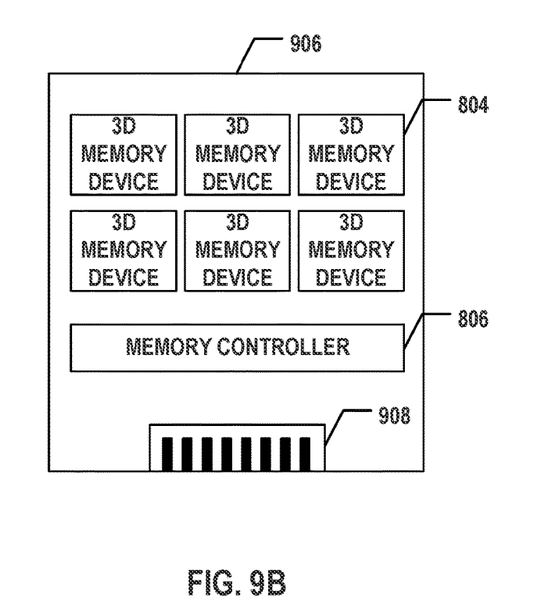
FIG. 9B illustrates a diagram of an exemplary solid-state drive (SSD) having a memory device, according to some aspects of the present disclosure.

Memory controller 806 and one or more memory devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 9A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 8). In another example as shown in FIG. 9B, memory controller 806 and multiple memory devices 804 may be integrated into an SSD 906. SSD 906 can further include an SSD connector 908 coupling SSD 906 with a host (e.g., host 808 in FIG. 8). In some implementations, the storage capacity and/or the operation speed of SSD 906 is greater than those of memory card 902.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a memory cell array formed by a plurality of memory cells, wherein the memory cells in a same row are connected to a same word line;
   a word line driving circuit configured to provide a driving voltage to a selected word line;
   at least one word line leakage detection circuit, configured to detect a leakage state of the selected word line; and
   at least one coupling circuit corresponding to the word line leakage detection circuit, wherein the coupling circuit comprises a switch, an electrostatic protection circuit, and a capacitor, the capacitor is arranged between the switch and the word line leakage detection circuit, the switch is disposed between the word line driving circuit and the capacitor, and the electrostatic protection circuit is disposed between the capacitor and the at least one word line leakage detection circuit, and the capacitor is used for isolating the word line leakage detection circuit and the word line driving circuit.

2. The 3D memory device of claim 1, wherein the at least one coupling circuit couples the selected word line to the at least one word line leakage detection circuit according to a leakage detect instruction signal.

3. The 3D memory device of claim 1, further comprising a bit line, wherein the memory cells are disposed at an intersection of the word line and the bit line, and the at least one word line leakage detection circuit determines the leakage state between the selected word line and an adjacent word line or between the selected word line and the bit line based on a voltage change of the selected word line within a preset time.

4. The 3D memory device of claim 3, wherein the at least one word line leakage detection circuit determines a difference between a reference input voltage and a voltage of the selected word line after the preset time, and when the difference is greater than or equal to a preset threshold voltage, the leakage state between the selected word line and the adjacent word line or between the selected word line and the bit line is determined as abnormal.

5. The 3D memory device of claim 4, wherein the reference input voltage is between 2.1 volts and 2.6 volts.

6. The 3D memory device of claim 4, wherein the preset threshold voltage is between 50 millivolts and 500 millivolts.

7. The 3D memory device of claim 1, wherein a capacitance of the capacitor is between 0.3 pF and 0.5 pF.

8. The 3D memory device of claim 1, wherein the at least one word line leakage detection circuit comprises:
   a comparator configured to determine a difference between a reference input voltage and a voltage of the selected word line,
   wherein the comparator comprises an adaptative resistor disposed at an output end of the comparator.

9. The 3D memory device of claim 8, wherein a resistance of the adaptative resistor is between 3,000 ohms and 10,000 ohms.

10. A method for detecting a leakage state of a three-dimensional (3D) memory device, wherein the 3D memory device comprises a plurality of memory cells and a plurality of word lines, and the memory cells in a same row are connected to a same word line, the method comprising:
    providing a first preset voltage provided by a driving voltage source to a selected word line and a first end of a coupling circuit;
    providing a second preset voltage to an adjacent word line adjacent to the selected word line;
    providing a reference input voltage to a second end of the coupling circuit;
    disconnecting the selected word line and the first end of the coupling circuit from the driving voltage source, and disconnecting the second end of the coupling circuit from the reference input voltage; and
    detecting a voltage of the second end of the coupling circuit and determining a first difference between the reference input voltage and the voltage of the second end of the coupling circuit,
    wherein when the first difference is greater than or equal to a first preset threshold voltage, a leakage state between the selected word line and the adjacent word line is determined as abnormal.

11. The method of claim 10, further comprising:
    coupling a voltage of the first end of the coupling circuit with the voltage of the second end of the coupling circuit through a capacitor of the coupling circuit.

12. The method of claim 10, wherein the second preset voltage is a ground voltage.

13. The method of claim 10, wherein the first preset voltage is greater than or equal to 10 volts.

14. The method of claim 10, wherein the first preset threshold voltage is between 50 millivolts and 500 millivolts.

15. The method of claim 10, wherein the reference input voltage is between 2.1 volts and 2.6 volts.

16. The method of claim 10, wherein after disconnecting the selected word line and the first end of the coupling circuit from the driving voltage source, the method further comprises:
    setting the selected word line to a floating status.

17. The method of claim 10, wherein the 3D memory device further comprises a bit line, and the memory cells are disposed at an intersection of the word line and the bit line, the method further comprises:
    providing the first preset voltage to the selected word line and providing the second preset voltage to the bit line.

18. The method of claim 17, further comprising:
    detecting the voltage of the second end of the coupling circuit and determining a second difference between the reference input voltage and the voltage of the second end of the coupling circuit,
    wherein when the second difference is greater than or equal to a second preset threshold voltage, a leakage state between the selected word line and the bit line is determined as abnormal.

19. A memory system, comprising:
    a three-dimensional (3D) memory device configured to store data, the 3D memory device comprising:
        a memory cell array formed by a plurality of memory cells, wherein the memory cells in a same row are connected to a same word line;
        a word line driving circuit configured to provide a driving voltage to a selected word line;

at least one word line leakage detection circuit, configured to detect a leakage state of the selected word line; and at least one coupling circuit corresponding to the word line leakage detection circuit, wherein the coupling circuit comprises a switch, an electrostatic protection circuit, and a capacitor, the capacitor is arranged between the switch and the word line leakage detection circuit, the switch is disposed between the word line driving circuit and the capacitor, and the electrostatic protection circuit is disposed between the capacitor and the at least one word line leakage detection circuit, and the capacitor is used for isolating the word line leakage detection circuit and the word line driving circuit; and a memory controller coupled to the 3D memory device and configured to control operations of the 3D memory device.

* * * * *